United States Patent
Olander et al.

(10) Patent No.: US 6,517,594 B2
(45) Date of Patent: Feb. 11, 2003

(54) AIR MANAGEMENT SYSTEM AND METHOD FOR CHEMICAL CONTAINMENT AND CONTAMINATION REDUCTION IN A SEMICONDUCTOR MANUFACTURING FACILITY

(75) Inventors: W. Karl Olander, Indian Shores, FL (US); Bruce G. Walker, Kuna, ID (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/806,798

(22) Filed: Apr. 4, 2001

(65) Prior Publication Data

US 2002/0134060 A1 Sep. 26, 2002

Related U.S. Application Data (63) Continuation-in-part of application No. 09/515,485, filed on Feb. 29, 2000, now Pat. No. 6,280,507.

(51) Int. Cl.$^7$ .............................................. B01D 46/00
(52) U.S. Cl. ............... 55/385.2; 55/385.1; 55/DIG. 18; 55/DIG. 29; 95/273; 454/187
(58) Field of Search .................... 55/385.1, 385.2, 55/DIG. 18, DIG. 29; 454/187, 188, 189, 190, 191, 192, 193; 438/905, 909

(56) References Cited

U.S. PATENT DOCUMENTS

| | | | |
|---|---|---|---|
| 4,927,438 A | * 5/1990 | Mears et al. | ............... 55/385.2 |
| 5,261,935 A | 11/1993 | Ishii et al. | |
| 5,626,820 A | 5/1997 | Kinkead et al. | |
| 5,827,339 A | * 10/1998 | Nagafune et al. | ........... 55/385.2 |
| 5,833,726 A | 11/1998 | Kinkead et al. | |
| 5,858,041 A | * 1/1999 | Wetkemeyer | ............... 55/385.2 |
| 5,946,221 A | 8/1999 | Fish, Jr. et al. | |
| 5,953,884 A | 9/1999 | Lawecki et al. | |
| 6,007,595 A | 12/1999 | Baik et al. | |
| 6,009,894 A | 1/2000 | Trussart | |
| 6,033,301 A | 3/2000 | Suwa | |
| 6,048,499 A | * 4/2000 | Hirayama | ................... 55/385.2 |
| 6,168,085 B1 | 1/2001 | Garcia | |
| 6,280,507 B1 | * 8/2001 | Walker | ....................... 454/187 |

* cited by examiner

*Primary Examiner*—David A. Simmons
*Assistant Examiner*—Minh-Chau T. Pham
(74) *Attorney, Agent, or Firm*—Steven J. Hultquist; William Ryann (57) ABSTRACT

An air manager and/or chemical containment apparatus, for environmental control of fumes from wet bench units of semiconductor manufacturing facilities. The air manager system is suitable for installation in an open architecture wet bench or an enclosed mini-environment wet bench, and includes an air source and an air exhaust arranged for flowing air across an open chemical tank, to entrain fumes from chemical in the tank that otherwise may migrate from the immediate vicinity of the tank, and transport such fumes to the exhaust with the air flowed from the air source to the exhaust. The chemical containment apparatus includes: (1) a thin film member including at least one solid portion and at least one cut-out portion; (2) a first scroll member positioned at one side of the thin film member for rotatorily moving the thin film member; (3) a motive driver operatively connected to the first scroll member for rotating the first scroll member; and (4) optionally, a second scroll member positioned at the other side of said thin film member for rotatorily receiving said thin film in synchrony with movement of the first scroll member.

46 Claims, 8 Drawing Sheets

| ⇨ | CHEMICAL FUMES |

AIR MANAGEMENT SYSTEM AND METHOD FOR CHEMICAL CONTAINMENT AND CONTAMINATION REDUCTION IN A SEMICONDUCTOR MANUFACTURING FACILITY

This application is a continuation-in-part of Ser. No. 09/515,485 filed Feb. 29, 2000, now U.S. Pat. No. 6,280,507.

FIELD OF THE INVENTION

The present invention generally relates to environmental control in semiconductor manufacturing operations, including management of airflow in controlled environments and containment and capture of hazardous fume species. More particularly, the present invention relates to improved chemical containment and contamination reduction apparatuses, systems, and processes in semiconductor manufacturing facilities. In a specific aspect, the invention relates to a chemical containment apparatus for capturing and reducing hazardous chemical fumes released by chemical tanks used in a semiconductor wet processing system.

DESCRIPTION OF THE RELATED ART

Semiconductor manufacturing must be performed in a particle-free environment, due to the fact that submicron size dimensions characterize the structural elements of the electronic circuitry, and that such circuitry can be rendered inoperative by the presence of even a single particle of dust. Semiconductor manufacturing process steps are therefore carried out within the confines of a clean room, which is a controlled environment through which an exhaust system continuously flows large amount of filtered air to remove dust, lint, and other particulate matter.

On the other hand, many semiconductor manufacturing process steps involve the use of chemicals that are toxic or otherwise hazardous to humans, which also necessitates use of localized exhaust equipment to contain, remove, or otherwise abate fumes from such chemicals.

Typically, efficiency of an exhaust system (i.e., the exhaust energy necessary to remove hazardous chemical fumes in a particular environment) is a function of two independent factors: the station exhaust ("pull" force) and the laminar airflow from the clean room ceiling ("push" force). These two motive forces of airflow form a push-pull system, which is the basis for system exhaust operation.

Exhaust efficiency can in one aspect be characterized by $C_e$ (Coefficient of Entry), which is defined by the American Conference of Governmental Industrial Hygienists as:

"The actual rate of flow caused by a given hood static pressure compared to the theoretical flow which would result if the static pressure could be converted to velocity pressure with 100% efficiency. The ratio of actual to theoretical flow."

Maximum possible exhaust efficiency is achieved when $C_e=1.0$. Typical $C_e$ values range from 0.2 to 0.7 (for highly efficient exhaust systems). In general, the greater the distance between the air inlet and exhaust outlet, the smaller is the value for $C_e$.

If unobstructed, ceiling-to-floor laminar airflow in a clean room loses relatively little volumetric flow velocity and therefore has relatively higher $C_e$ value. Typically, an 80 feet per minute (fpm) laminar air stream as measured at the ceiling is slightly attenuated to approximately 71 fpm at the deck level, away from semiconductor processing equipment and systems below the deck. When such air stream is pulled further down to beneath the deck level, semiconductor processing equipment, most notably chemical tanks, obstruct flow path for such air stream and induce air turbulence in their vicinity. The air stream is bent or separated by the obstructing objects, and volumetric flow velocity of such air stream is reduced to a level that is too low to fully contain and remove chemical fumes.

Because of these factors, conventional exhaust systems exhibit marginal fume capture capability, and many fail to consistently control contamination and hazardous fumes under the deck, resulting in occasional fumes spills into the process and operator environment.

Critical Capture Velocity (CCV) is generally used in characterizing minimum fume capture capacity required for an exhaust system in a clean room environment. CCV is defined as the minimum airflow velocity measured over a process tank at which fumes will be controlled below the station deck. A properly balanced system can achieve this velocity (empirically determined to be at values of 70 fpm or greater) with a combination of exhaust flow rate, laminar airflow, and minimal deck opening size, if enough exhaust capacity is available.

As wafer sizes used in the semiconductor industry grow to 300 mm or more and require larger deck openings, however, CCV becomes more difficult to achieve, and facility exhaust capacity is stretched beyond its limits. Conventional push-pull systems will not be able to produce enough combined force to achieve capture of hazardous fumes in large size wafer facilities now under design and construction.

Additionally, the exhaust systems in many 200-millimeter (mm)-facilities in current use are unable to achieve CCV because of a disparity in the exhaust capacity, deck opening sizes, and laminar push. Consequently, fume spill incidents occur in many wafer fabs, resulting in yield loss, excessive rework, process disruption, environmental and regulatory noncompliance, injury, and litigation. Additionally, the economics of the semiconductor market demand a reduction in overall production costs as semiconductor fabs move to larger wafer sizes. The international semiconductor industry association SEMATECH has determined a need to reduce exhaust energy consumption by a magnitude of 35 to 40% from current average levels, even as progressively increasing wafer sizes necessitate larger, higher capacity, higher energy consumption exhaust systems.

It would therefore be a significant advance in the art: (i) to provide an improved air management system, with increased efficiency for containing hazardous chemical fumes and reducing fume spill, while consuming less energy; (ii) to provide an air management system for chemical containment and contamination reduction, which assures maintenance of CCV at values of 70 fpm or greater; and (iii) to increase the $C_e$ of exhaust equipment toward a value of unity.

In the fabrication of semiconductor wafers, a multitude of cleaning steps is required to remove impurities from the surface of the wafer prior to subsequent processing. Generally, a batch of wafers is dipped into one or more chemical tanks that contain chemicals that are needed for clean or etch functions.

A serious problem associated with such immersion wet cleaning process is that the liquid chemicals contained by the chemical tanks release hazardous fumes at their surfaces. Such fumes tend to migrate to the environment surrounding the tanks and pose environmental hazards or cause worker injuries.

Containment of hazardous chemicals in semiconductor wet processing systems is done today using below-deck exhaust systems, which function to capture chemical fumes or keep them at or below the deck.

In order to effectively keep hazardous chemicals under control and out of the workspace above the deck, the below-deck exhaust systems have to effectuate flow of large volumes of filtered air through the wet cleaning tools at very high rates, e.g., on the order of 150 cubic feet per minute (cfm). High capacity exhaust systems are expensive, energy-consuming, and difficult to install and maintain.

Moreover, pressure fluctuations in the exhaust air stream or in the semiconductor processing system overall still cause deleterious turbulence and loss of fume control at certain localities in the system, resulting in formation of "plumes" of hazardous vapors.

Some wet processing systems employ safety lids as supplemental means for fume control. The safety lids isolate each chemical tank from the environment to reduce migration of hazardous chemicals into workplaces. They also function to reduce dissipation of useful chemicals due to migration of fumes.

Commonly used safety lids include clamshell type and drawbridge type lids. Such lids significantly reduce the flexibility of wet processing systems as well as the wafer throughput. The opening and closing of such lids still results in local turbulence. Accordingly, such lids cannot completely eliminate escape of chemical fumes from the chemical tank. Moreover, currently available safety lids are mechanically complex, expensive, and difficult to maintain. Further, hazardous chemical vapors tend to condense on the bottoms of the safety lids, which may result in more severe worker injuries or potential environmental problems.

It therefore would be a significant advance in the art to provide a chemical containment apparatus that is economic, easy to install and maintain, energy saving, and more effective in fume control than the conventionally available alternatives. Moreover, it would be advantageous to have a chemical containment apparatus that presents minimal limitation on the flexibility of the wet processing systems, and that does not cause condensation of chemical vapors in its vicinity.

SUMMARY OF THE INVENTION

The present invention relates to environmental control systems useful in semiconductor manufacturing operations.

The present invention in one aspect provides active filtered airflow "push" elements, located proximate to a fume-releasing liquid chemical tank, and in such a position as to direct filtered airflow across the surface of such tank, thereby capturing hazardous fumes rising therefrom. Directed airflow may be filtered to an efficiency of 99.9999%.

The present invention in one specific apparatus aspect relates to an air manager, positionable in relation to a chemical tank containing chemical emitting fumes, for entraining fumes and preventing their escape, such air manager comprising:

an airflow source constructed and arranged to generate an air stream; and an airflow exhaust comprising an exhaust inlet for receiving the air stream;

wherein the airflow source and the airflow exhaust are positioned in relation to one another so that the air stream generated by the airflow source passes across an upper surface of the chemical tank, whereby fumes produced at the surface of the chemical tank are captured by and entrained in the air stream, and transported to the airflow exhaust.

In a semiconductor manufacturing facility in which the chemical tank is below a deck, the air stream flowed across the open chemical tank is maintained below the deck as well.

The air manager may be embodied in a structural assembly comprising a plate member having air source and air exhaust members mounted thereon, whereby the air manager may be employed as a retrofit apparatus for existing semiconductor manufacturing facilities, e.g., in an open architecture wet bench facility.

In a specific aspect, the air manager of such type, installed in an open architecture wet bench facility and with the air source member incorporating or arranged for connection to a high purity air supply, may be employed to provide a level of cleanliness approaching that routinely achieved by far more expensive mini-environment wet bench facilities.

In yet another aspect, a wet bench facility including an open topped chemical tank is shrouded by air manager units of the type described hereinabove, to provide a "virtual wall" containment of the fumes from the tank, wherein each virtual wall includes an air source and an air exhaust, arranged to produce a generally flat airstream bordering a perimeter area of the chemical tank or the wet bench itself.

Another aspect of the invention relates to a scroll lid assembly for preventing chemical fumes from escaping from a semiconductor wet processing system, including:

a thin film member including at least one solid portion and at least one cut-out portion;

a first scroll member positioned at a first side of the thin film member for rotatorily moving the thin film member;

a motive driver operatively connected to the first scroll member for rotating the first scroll member; and optionally, a second scroll member positioned at a second side of the film member for rotatorily receiving the thin film, in synchrony with rotatory movement of the first scroll member.

Such scroll lid assembly is useful as a chemical containment apparatus in various areas of semiconductor manufacturing processes that use hazardous liquid chemicals.

In one aspect of the present invention, such scroll lid assembly is incorporated in a chemical tank assembly of a semiconductor wet processing system, which includes:

a chemical tank arranged to contain a liquid chemical producing deleterious chemical fumes at its upper surface; and at least one scroll lid assembly as described hereinabove, positioned above the chemical tank, for reducing escape of chemical fumes from said chemical tank into a surrounding environment.

Such chemical tank assembly may also incorporate an air manager as described hereinabove to prevent deleterious condensation of chemical fumes underneath the thin film member of the scroll lid assembly, wherein the air manager may be placed between the scroll lid assembly and the chemical tank below it.

A further aspect of the present invention relates to a wet station assembly of a semiconductor manufacturing facility. The wet station assembly includes a liquid chemical tank, a deck positioned above the tank and having an opening over the tank for ingress and egress of semiconductor manufacturing workpieces, a laminar downflow air source, a below-deck exhaust, and a below-deck airflow source positioned in relation to the below-deck exhaust to flow an air stream over a surface of liquid in the liquid chemical tank at a sufficient rate and in a sufficient volumetric flow to achieve Critical Capture Velocity (CCV) of vapor released from the liquid during operation of the wet station assembly. The below-deck airflow source of such wet station assembly may comprise an air plenum member including a purification medium and a motive air driver for effecting flow of air from the plenum member across the liquid surface of the liquid chemical tank. The wet station assembly can further comprise a scroll lid assembly as described hereinabove, which is positioned below the deck, and above the liquid chemical tank and the below-deck airflow source.

Yet another aspect of the present invention relates to an open architecture wet processing station of a semiconductor manufacturing facility, comprising:

a wet bench including one or more chemical tanks containing liquid chemicals that produce deleterious chemical fumes at their surfaces;

an exhaust situated in relation to the chemical tank for capturing at least a portion of the deleterious chemical fumes by suction; and and at least one environmental management system, selected from the group consisting of air managers and scroll lid assemblies, positioned to substantially prevent escape of the chemical fumes from the vicinity of the wet bench.

Preferably such open architecture wet processing station comprises at least one scroll lid assembly as described hereinabove. One or more air managers may be employed in such open architecture wet processing station, for further capture of chemical fumes that escape beyond the scroll lid assembly. The filtered airflow source and the airflow exhaust of each air manager are positioned in relation to one another so that the air stream generated by the filtered airflow source functions as an air wall outside and adjacent to at least one chemical containment apparatus to capture chemical fumes escaping barriers formed by the chemical containment apparatus.

In one specific embodiment of the present invention, the open architecture wet processing station comprises air manager units, one of which is positioned in an open front portion of the wet bench, one of which is positioned at a first side of the wet bench and a second one of which is positioned at a second side of the wet bench, so that air streams generated by these air, managers form an "air wall" enclosure for capturing chemical fumes, in operation of the wet bench.

A still further aspect of the present invention relates to an open architecture wet processing station comprising one or more air managers, wherein each air manager comprises:

an airflow source constructed and arranged to generate an air strewn; and an airflow exhaust comprising an exhaust inlet for receiving said air stream;

wherein the airflow source and the airflow exhaust are positioned in relation to one another so that the air stream generated by the airflow source functions as an air wall outside and adjacent to a source of chemical fumes in said station.

The present invention also relates to a method of containing hazardous fumes emanating from the surface of a liquid chemical in a liquid chemical tank, comprising the steps of. (1) providing an airflow source for generating an airflow and an airflow exhaust having an inlet constructed and arranged to receive the airflow; (2) positioning the airflow source and the airflow exhaust inlet in relation to one another and to the liquid chemical tank, so that airflow from the air flow source flows over the surface of liquid chemical in the liquid chemical tank; (3) flowing an air flow from the airflow source in a generally horizontal stream over the surface of the liquid chemical to the airflow exhaust inlet, whereby substantially all deleterious fumes emanating from the surface of the chemical are captured by and entrained in the airflow, and flow into the airflow exhaust. The airflow can be confined to a region above the surface of the liquid by guide structures at sides of the liquid chemical tank; alternatively, a scroll lid assembly positioned above the liquid chemical tank can confine it.

Another aspect of the invention relates to a semiconductor fabrication facility clean room including a ceiling-to-floor laminar airflow system, an exhaust system, a liquid chemical tank for containing a liquid chemical composition producing fumes from a liquid surface thereof, and an air manager assembly including an airflow source and an airflow exhaust inlet arranged in facing relationship to one another at opposing sides of the liquid chemical tank above the liquid surface, with the airflow source and airflow exhaust inlet being constructed and arranged to maintain airflow across the surface of the liquid chemical from the airflow source to the airflow exhaust inlet at an airflow velocity above the Critical Capture Velocity of chemical liquid fumes from the liquid chemical in the liquid chemical tank.

A still further aspect of the invention relates to a method of operating a semiconductor fabrication facility clean room including a ceiling-to-floor laminar airflow system, an exhaust system and a liquid chemical tank for containing a liquid chemical composition producing fumes from a liquid surface thereof, such method comprising providing a filtered airflow source and airflow exhaust inlet at opposite sides of the liquid chemical tank above the liquid surface, and directing airflow across the liquid chemical surface from the filtered airflow source to the airflow exhaust inlet at an airflow velocity above the Critical Capture Velocity of chemical liquid fumes from the liquid chemical in the liquid chemical tank.

Various other aspects, features and embodiments of the invention will be more fully apparent from the ensuing disclosure and claims.

DETAILED DESCRIPTION OF THE INVENTION, AND PREFERRED EMBODIMENTS THEREOF

As discussed above, conventional push-pull exhaust systems in clean rooms are insufficient to fully capture and remove hazardous fumes from processing stations. In a conventional clean room exhaust system, the influence of the exhaust inlet on volumetric airflow is reduced by 90% just one duct diameter away from the inlet. Thus, for an eight-inch duct, 200 feet per minute (fpm) exhaust flow rate is reduced to 20 fpm eight inches away from the duct inlet. Unobstructed output of the laminar flow filters in the ceiling of a clean room is only attenuated by 90% at a distance greater than 30 diameters. Obstructions may well be present and reduce the laminar airflow by introducing turbulence and separating the air streams, thereby markedly reducing this efficiency, and dramatically attenuating volumetric airflow rates downstream of the obstruction.

Figure 1:
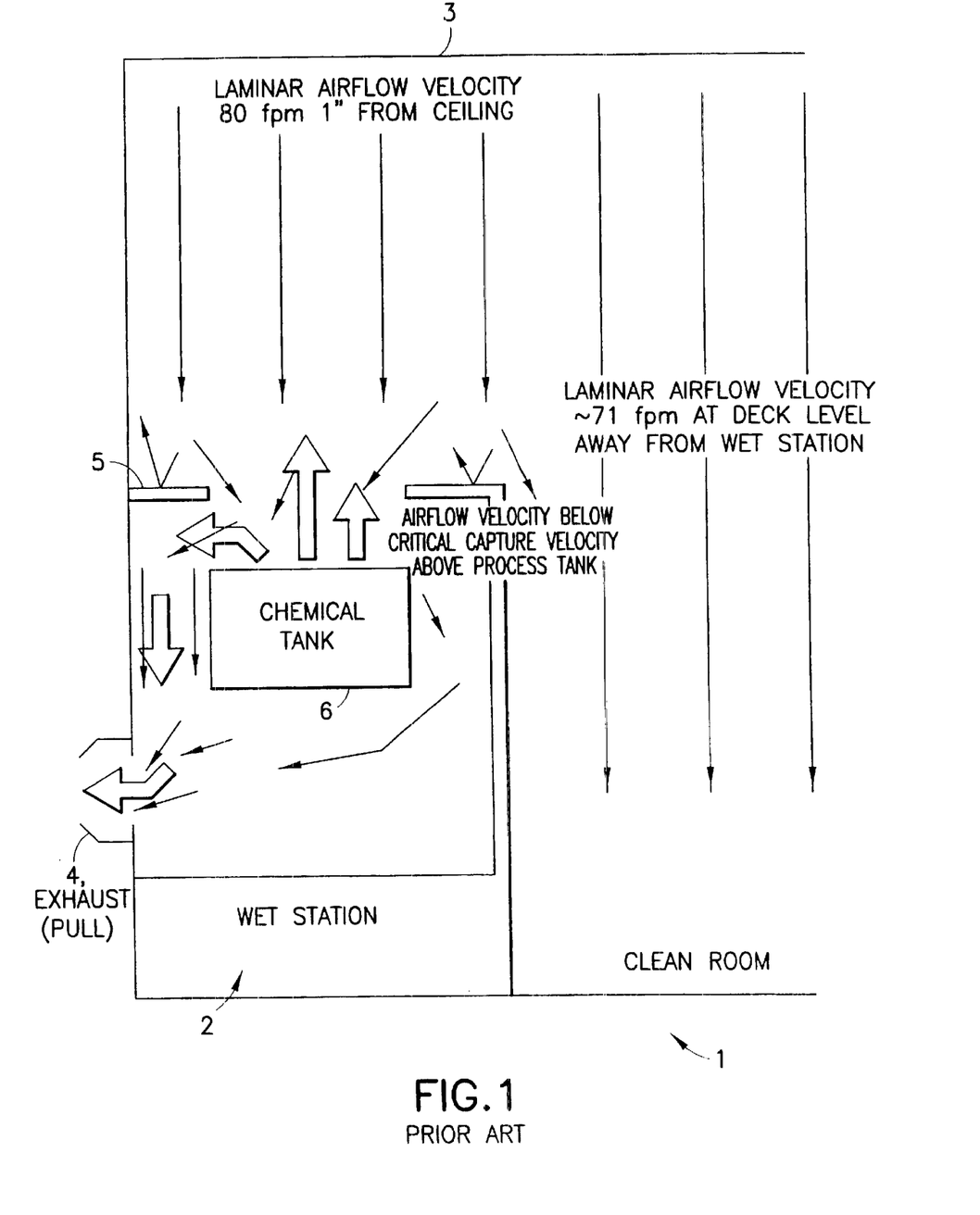
FIG. 1 is a schematic representation depicting airflow in a prior art clean room.

FIG. 1 ("Prior Art") schematically depicts a typical prior art clean room 1 with a processing station 2, and airflow patterns at various locations. Laminar airflow from the ceiling 3 at 80 fpm is provided by the clean room air filtration and circulation system. This airflow comprises the "push" component of the push-pull process station exhaust. The "pull" is provided by an exhaust 4 located beneath the deck 5 at the processing station. Distant from the exhaust system, the unobstructed laminar airflow velocity is attenuated to approximately 71 fpm at the system deck level.

Above the process chemical tank 6, however, due to turbulence and delamination of the air stream caused by the obstructions of the processing station, airflow is below the Critical Capture Velocity, and is unable to contain all hazardous fumes emanating from the chemical tank 6. Detailed measurements taken at different points above the chemical tank 6 reveal high airflow velocities at the front and rear of the tank, and low velocities at its center. With some deck and tank installation configurations, it is not uncommon to find airflow velocities over the center of the tank in the 0 to 10 fpm range.

Under these conditions, fume control is lost, resulting in a "plume" of hazardous vapors over the center of the tank. Buoyant forces over a heated vessel may exacerbate this weakness and produce a substantial fume cloud. In many applications, a plume above the process tank has been accepted as a necessary concomitant condition of a processing station.

FIG. 1 ("Prior Art") also represents the situation facing currently adequate exhaust systems (those which balance the push of clean room laminar airflow source, the pull of exhaust system exhaust, and the size of the deck opening above the process tank), as larger wafer sizes force the deck opening size to increase and/or necessitate exhaust power at a level beyond the existing system's capacity.

The present invention resolves such deficiency of the prior art by the provision of an exhaust system that maintains airflow at or above the Critical Capture Velocity over the entire surface of the process tank, by introducing an additional "push" source of airflow force beneath the deck, proximate to the surface of the tank. This push source, in combination with the pull of the system exhaust, results in an airflow stream across the surface of the tank that is sufficient to capture all hazardous fumes emanating therefrom.

The localized push source dramatically increases the efficiency of airflow management around the tank, allowing a large reduction in the size and energy requirements of the exhaust motor, as compared to reliance on the push of the clean room laminar airflow source. The system also enables the maintenance of a minimum airflow at or above the Critical Capture Velocity for any given processing station, regardless of the wide variation in volume and velocity of clean room laminar airflow characteristic of air management systems from fab to fab.

Figure 2:
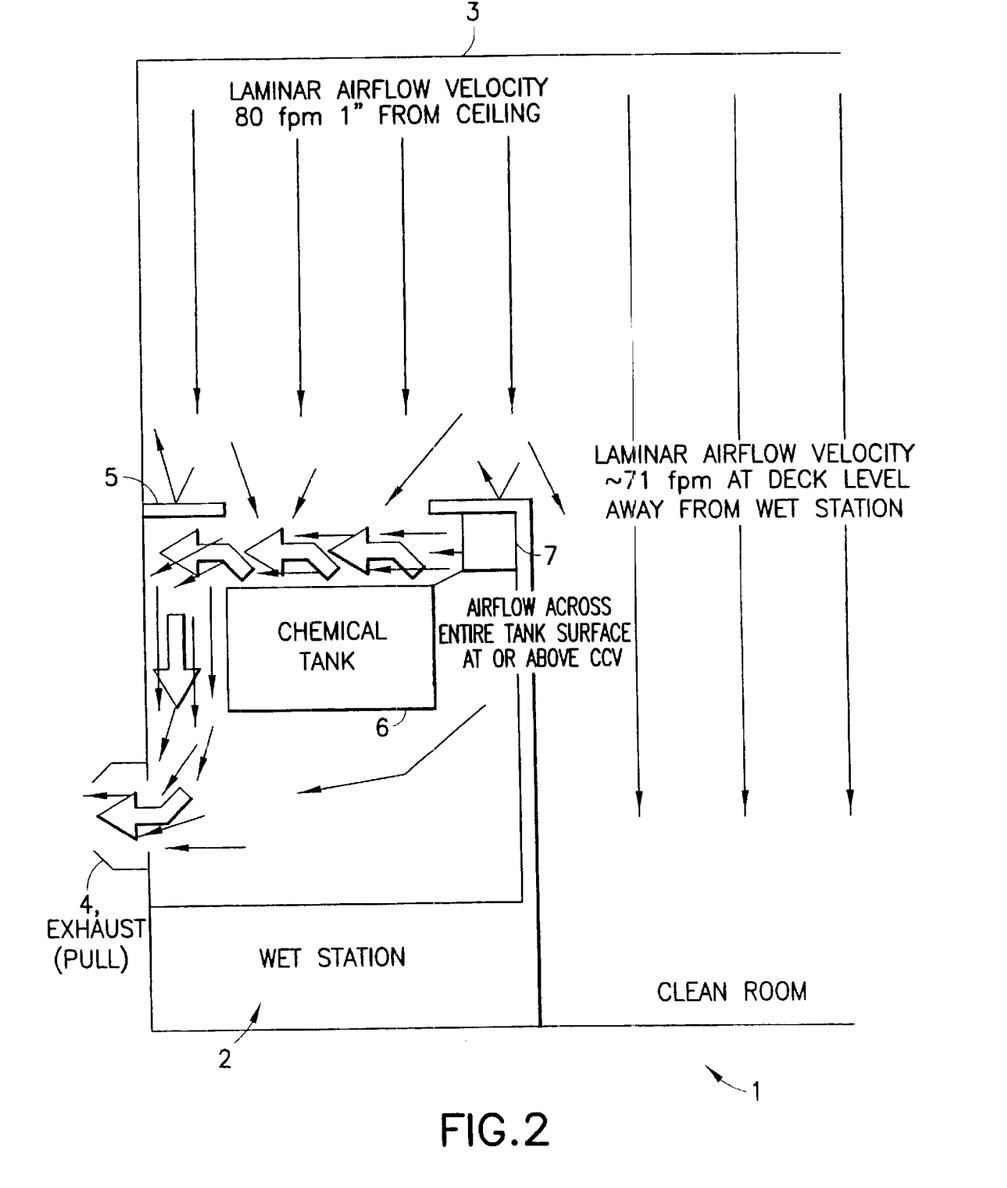
FIG. 2 is a schematic representation depicting airflow in a clean room employing an air manager and chemical tank assembly of the present invention.

FIG. 2, wherein corresponding features and elements are correspondingly numbered with respect to FIG. 1 ("Prior Art"), depicts a processing station 2 in a clean room 1, with the air manager 7 of the present invention installed. The air manager 7 works cooperatively with the clean room laminar airflow (push) and the station exhaust (pull), providing an additional "push" motive force of airflow near the exhaust port. The air manager directs a stream of airflow horizontally across the surface of the tank 6, parallel to the surface of the liquid therein.

This air manager flow, in addition to the clean room laminar airflow entering the deck opening from above the tank, completely captures and directs all chemical fumes emanating from the tank to the exhaust 4 located below the deck 5, with the filtered airflow across the tank being maintained at or above the Critical Capture Velocity.

Figure 3:
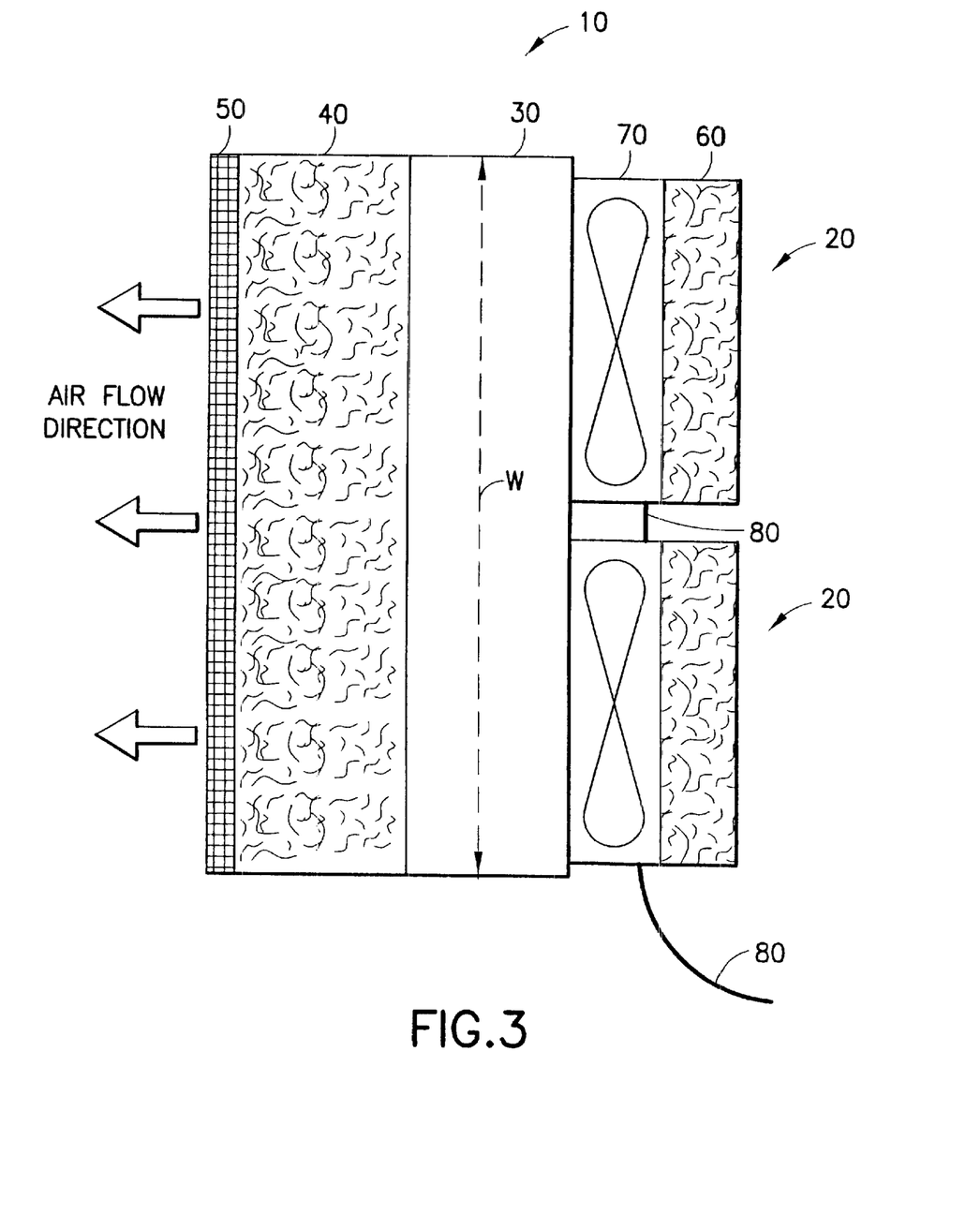
FIG. 3 is a plan view of apparatus according to one embodiment of the present invention.

FIG. 3 is a schematic representation in plan view of an air manager apparatus according to one embodiment of the present invention. The air manager, indicated generally at 10, comprises air plenum 30 and at least one fan assembly, indicated generally at 20 (two fan assemblies are shown in FIG. 3). Air plenum 30, of transverse dimension W as indicated (W corresponding to the transverse dimension, or width, of the chemical tank) contains ULPA (Ultra Low Penetrating Air, having 99.999% removal efficiency for particles 0.1 micron or larger) filter media 40 and filter grill 50. Fan assembly 20 comprises powered fan 70 and chemisorbent backfilter 60. Fan 70 is powered in any suitable manner, e.g., electrically, and in the embodiment shown is operatively connected by cable 80 to a suitable power source (not shown).

Figure 4A:
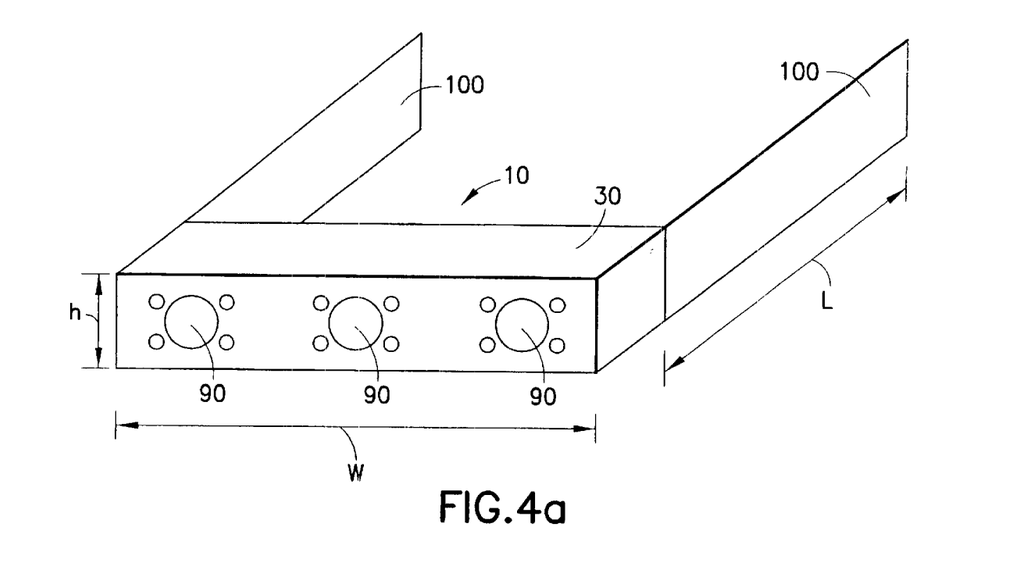
FIGS. 4a and 4b are perspective views of apparatus according to another embodiment of the present invention.

FIG. 4a is a schematic perspective view of the rear side of the air manager 10 according to another embodiment of the present invention. Fan mounting holes 90 are provided in the rear face of the chamber constituting air plenum 30, for the mounting of up to three fan assemblies (not shown). Air plenum 30 is of transverse dimension W as indicated, where W corresponds to the transverse dimension (width) of the chemical tank (transverse to direction of airflow from air manager).

Attached to the sides of air plenum 30 and extending therefrom in the front direction are optional airflow guide panels 100. Airflow guide panels 100 are at least of length L as shown, where L corresponds to the length of the chemical tank (along the direction of airflow from the air manager). Both air plenum 30 and airflow guide panels 100 are of height h as shown, where h corresponds generally to the height of the air manager, in the vertical distance separating the top of the tank from the lower surface of the deck beneath which the tank is positioned.

Figure 4B:
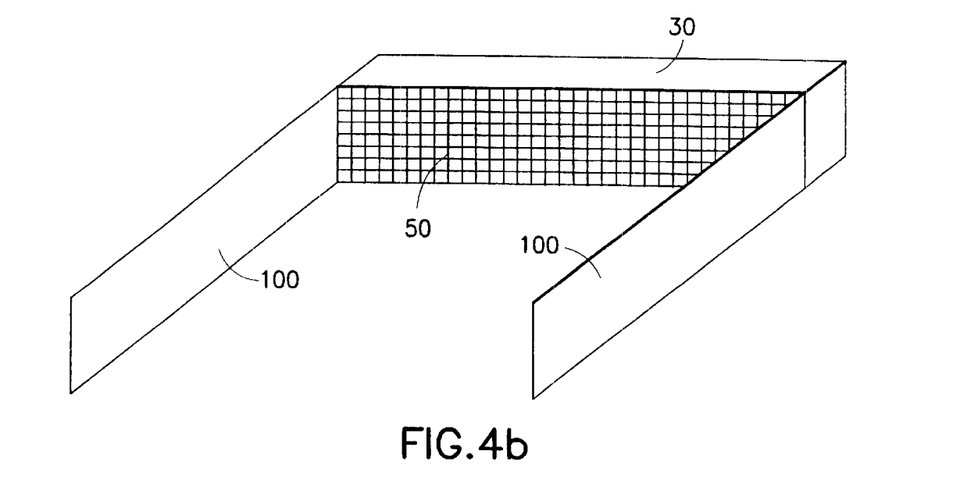

FIG. 4b is a schematic representation in perspective view of the front side of the air manager of FIG. 4a, showing an optional filter grill 50. Filter grill 50 is a regular, porous, air-permeable screen formed of any suitable material, such as, e.g., ¼ PVDF grill (machined) or 80% open Teflon® mesh. Filter grill 50 retains a filtration medium within the body of air plenum 30, while allowing even, high-volume airflow from air plenum 30 to the area over the chemical tank.

In the broad practice of the present invention, the various components of the air manager (fans, etc.) may be interconnected in a variety of ways, and some components (i.e., fans) optionally omitted, as required in any given application, and readily determinable by one of ordinary skill in the art without undue experimentation and without departing from the scope and the spirit of the invention as herein disclosed. In particular, the fan assemblies or other source of airflow motive force may be integral to the air manager or positioned remotely from the air plenum, and the airflow carried thereto via hoses, pipes, ducts, channel elements, manifolds, etc. Options for airflow motive force include facility Clean Dry Air (CDA), facilities nitrogen ($N_2$) or compressed air from a chase-located compressor.

Figure 5:
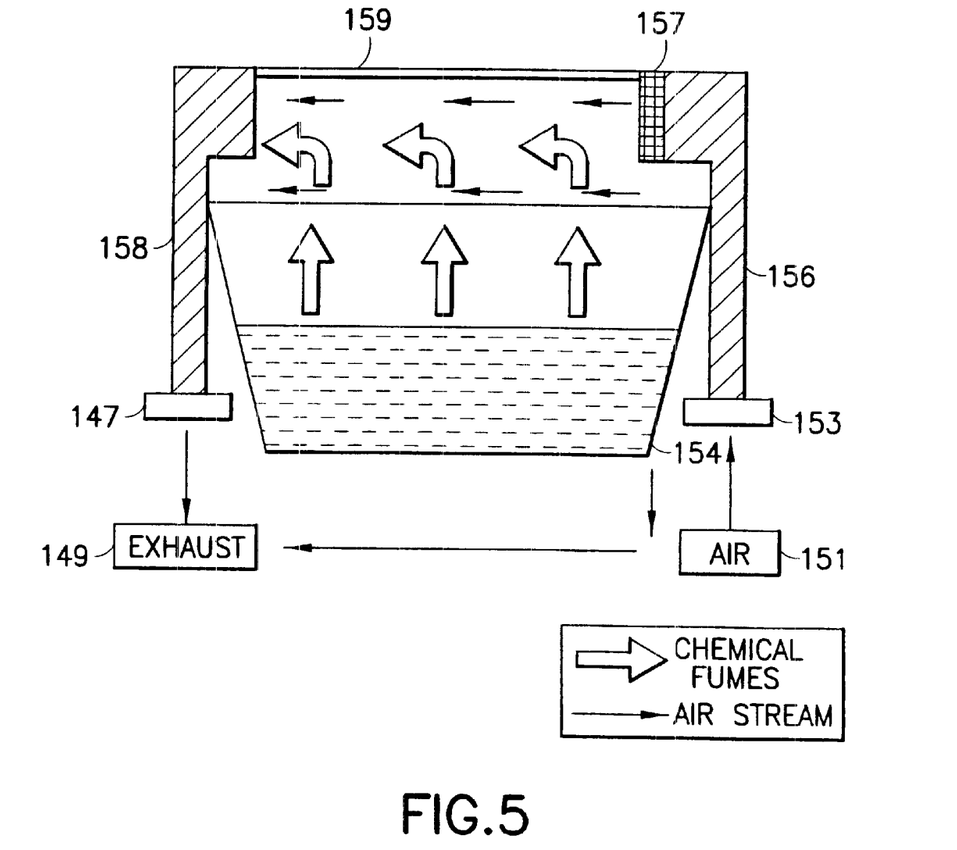
FIG. 5 is a view of an open architecture wet processing station having an air manager associated therewith.

FIG. 5 comprises an open architecture wet processing station incorporating a unitary air manager assembly.

Over the chemical tank 154 that releases hazardous chemical fumes is positioned the unitary air manager assembly, which although shown in spaced relationship to the tank 154 is actually in use reposed on the lip or edge of the chemical tank. Filtered airflow source 156 is positioned at one side of the chemical tank 154 and airflow exhaust 158 is positioned at an opposite side of the chemical tank 154, facing the filtered airflow source 156. Both source 156 and exhaust 158 are mounted on a plate member 159 to form the unitary assembly. In such manner, air stream generated by the filtered airflow source 156 flows across the upper surface of the chemical tank 154, so that substantially all deleterious fumes produced at the upper surface of the chemical tank 154 are captured by it, and transported to the airflow exhaust 158.

The airflow exhaust 158 is provided with a connector 147 by which the exhaust 158 can be connected to the plenum exhaust 149. In like manner, the source 156 is provided with a connector 153 by which the source 156 can be connected to an air supply unit 151, such as a compressed clean dry air line from the utilities of the semiconductor manufacturing facility.

It is preferred that the filtered airflow source comprises at least one purification medium (not shown), selected from particulate filter media and chemisorbent media. More preferably, such filter media is an Ultra Low Penetrating Air (ULPA) media having a 99.999% removal efficiency for removing particles 0.1 micron or larger in size.

The filtered airflow source may also comprises a filter grill 157, which is a regular, porous, and air-permeable screen made of 25% PVDF or 80% open Teflon® mesh.

The unitary air manager of the present invention can be used in an open architecture wet processing station for enclosing the space between the wet bench and the plenum box exhaust (using a below deck exhaust) of such processing station.

An open architecture wet processing station generally comprises: (1) a wet bench having one or more chemical tanks that release hazardous chemical fumes; and (2) an exhaust system that flows exhaust through a plenum box and downwardly out of the tool, thereby capturing the chemical fumes by suction. Generally, the plenum box exhaust can only capture a portion of the chemical fumes, and the rest escape from the wet bench and subsequently contaminate the surrounding environment.

The invention relates in one aspect to an air manager system suitable for installation in an open architecture wet bench or an enclosed mini-environment wet bench. Such air manager system includes an air source and an air exhaust arranged for flowing air across an open chemical tank, e.g., in a semiconductor manufacturing facility, to entrain fumes from chemical in the tank that otherwise may migrate from the immediate vicinity of the tank, and transport such fumes to the exhaust with the air flowed from the air source to the exhaust. In a semiconductor manufacturing facility in which the chemical tank is below a deck, the flowing air across the open chemical tank is maintained below the deck as well.

The air manager may be embodied in a structural assembly comprising a plate member having air source and air exhaust members mounted thereon, whereby the air manager may be employed as a retrofit apparatus for existing semiconductor manufacturing facilities, e.g., in an open architecture wet bench facility.

In a specific aspect, the air manager of such type, installed in an open architecture wet bench facility and with the air source member incorporating or arranged for connection to a high purity air supply, may be employed to provide a level of cleanliness approaching that routinely achieved by far more expensive mini-environment wet bench facilities.

In yet another aspect, a wet bench facility including an open topped chemical tank is shrouded by air manager units of the type described hereinabove, to provide a "virtual wall" containment of the fumes from the tank, wherein each virtual wall unit includes an air source and an air exhaust, arranged to produce a generally flat airstream bordering a perimeter area of the chemical tank or the wet bench itself.

Figure 6:
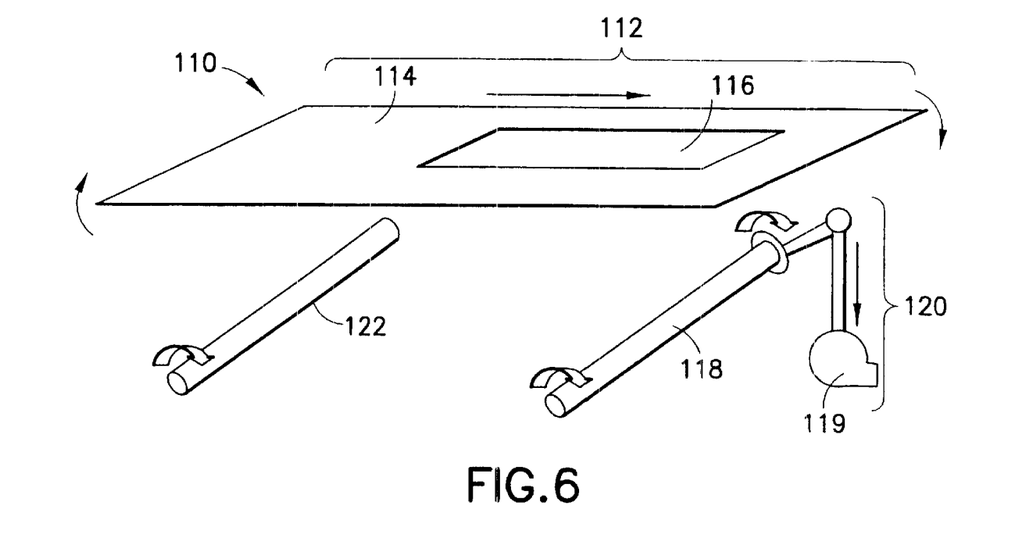
FIG. 6 is an exploded view of a scroll lid assembly according to one embodiment of the present invention.

FIG. 6 shows a generalized scroll lid assembly 110 useful in connection with the air manager in one preferred embodiment of the present invention. Such scroll lid assembly comprises a thin film member 112, a first scroll member 118, a motive driver 120, and a second scroll member 122.

The thin film member 112 functions as a barrier or a cover that prevents migration of hazardous chemical fumes. It can be made of any suitable material known in the art, and it may be opaque, transparent, or semitransparent, with illustrative materials including plastics, ceramics, metals, etc., provided that the material is sufficiently flexible at its respective end regions to permit roll-up and unwinding in operation of the device. In a specific embodiment of the present invention, the thin film member comprises a material that is non-reactive with the chemical fumes. Preferably, it is made of a transparent or semitransparent material, so that the operator of a wet processing system can readily observe the chemical tanks or wet-processing tools (not shown) covered by such thin film member. More preferably, the thin film member comprises a transparent polymeric material.

The motive driver 120 for rotating the driving scroll member 118 may include, but are not limited to, any suitable electric, pneumatic, or hydraulic motive driver known in the art. A person skilled in the art can readily determine the type of motive driver used for purpose of practicing the present invention, without undue experimentation. Preferably, such motive driver comprises an electric motor 119.

The scroll lid assembly 110 of FIG. 6 preferably comprises a second scroll member 122, which is a receiving scroll member positioned at an opposite side of the thin film member 112 in relation to the driving scroll member 118, for rotatorily (i.e., by rotational movement of the scroll member) receiving the thin film member. Such receiving scroll member 122 synchronously rotates with the driving scroll member 118 for rolling and unrolling the thin film member 112.

Preferably, the receiving scroll member 122 is operated by a spring follower (not shown), which causes the receiving scroll member 122 to actively pull and roll the thin film member 112 when the driving scroll member 118 is moving such thin film member 112 toward it (in an opposite direction as that shown by the arrow head in FIG. 1).

In a specific aspect of the present invention, both the driving scroll member (i.e. the first scroll) 118 and the receiving scroll member (i.e. the second scroll) 122 are made of a material that is non-reactive with the chemical fumes from the wet processing system, so that they are not susceptible to corrosion by such chemical fumes. Preferably, both scroll members are made of polyvinylindenefluoride (PVDF).

The foregoing embodiments of the invention have been directed to semiconductor processing wet stations in which the liquid chemical tank is of a conventional square or rectangular form, but it will be recognized that the utility of the invention is not thus limited, and the invention may be practiced in wet station facilities in which the tank is of circular cross-section (i.e., of cylindrical form).

Figure 7:
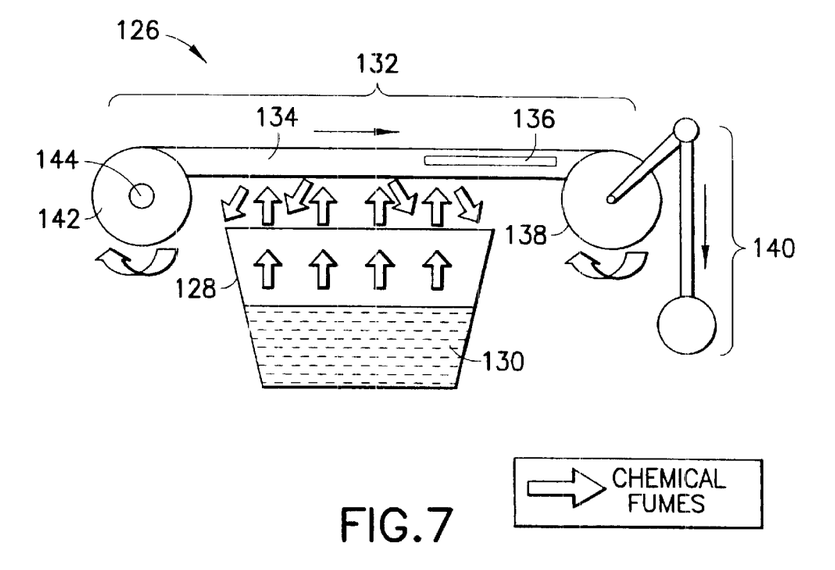
FIG. 7 is a cross-sectional view of a chemical tank covered by a scroll lid assembly, with the thin film member of the scroll lid assembly moved to one position for preventing migration of chemical fumes from the chemical tank.

FIG. 7 shows a cross-sectional view of a chemical tank assembly 126, comprising a chemical tank 128 that contains a liquid chemical 130 producing deleterious chemical fumes. Such chemical tank assembly also comprises a scroll lid, positioned above the chemical tank 128. The thin film member 132 of such chemical containment apparatus overlies the chemical tank 128, without directly contacting the upper surface of such tank. The thin film member 132 comprises a solid portion 134 and a cutout portion 136.

A motive driver assembly 140 rotates a driving scroll member 138, which in response rotatorily moves the thin film member 132 in a direction (as shown by the arrow head in FIG. 6) so that the solid portion 134 of such thin film member is extended above the chemical tank 128 to fully cover such tank and to substantially eliminate migration of chemical fumes into surrounding areas.

A receiving scroll member 142, operated by a spring follower 144, rotates in synchrony with the driving scroll member 138 for moving the thin film member 132 in one direction or the other.

Figure 8:
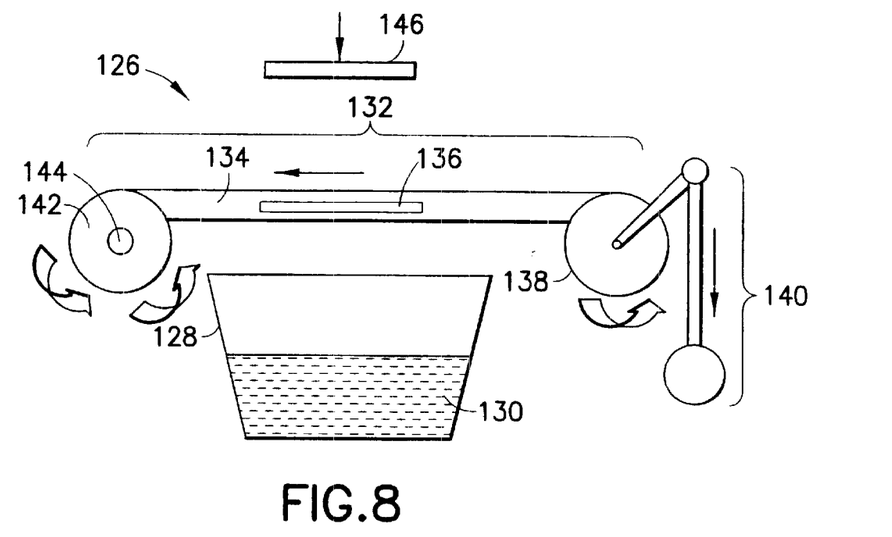
FIG. 8 is a cross-sectional view of the same chemical tank as in FIG. 7, with the thin film member of the scroll lid assembly moved to another position for permitting access to the chemical tank.

FIG. 8 shows the same chemical tank assembly 126 as in FIG. 7, while the driving scroll member 138 is now moving the thin film member 132 in an opposite direction (as shown by the arrow head in FIG. 7) so that the cut-out portion 136 of such thin film member is above the chemical tank 128, permitting access to such chemical tank. Specifically, a semiconductor wafer 146 can be placed into the chemical tank 128 through the cutout portion 136, for processing.

FIGS. 7 and 8 demonstrate how the scroll lid assembly of the present invention is "closed" (as in FIG. 7) and "opened" (as in FIG. 8). Unlike the conventional clamshell type lids or drawbridge type lids, the scroll lid assembly of the present invention, when opened or closed, results in very little pressure variation in its vicinity. It minimizes turbulence and therefore prevents formation of turbulence-induced chemical plumes.

Such scroll lid assembly can be used in concert with an air manager to further reduce escape of chemical fumes into surrounding areas.

Figure 9:
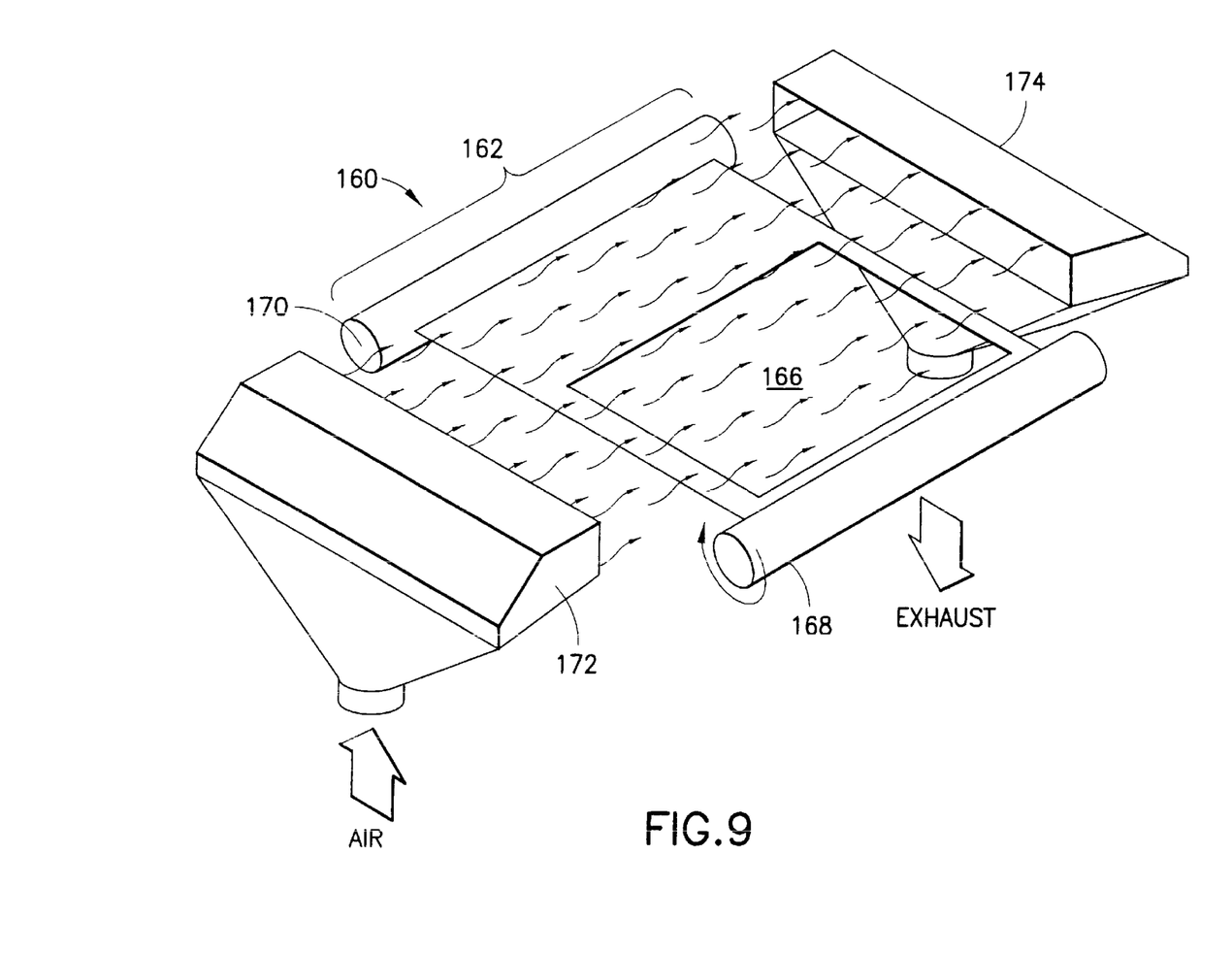
FIG. 9 is a three-dimensional elevational view of an air manager used in combination with a scroll lid assembly.

FIG. 9 shows a perspective elevation view of a scroll lid assembly 160 and an air manager that comprises a filtered airflow source 172 and an airflow exhaust 174.

The scroll lid assembly 160, as described herein above, comprises: (1) a thin film member 162, having a solid portion 164 and a cutout portion 166; (2) a first scroll member 168, and (3) a second scroll member 170.

The filtered airflow source 172, posited at one side of the thin film member 162, generates an air stream (as shown by the arrow heads in FIG. 6), which flows underneath the thin film member 162 of the chemical containment apparatus 160, into the airflow exhaust 174 that is posited at the other side of the thin film member 162.

Figure 10:
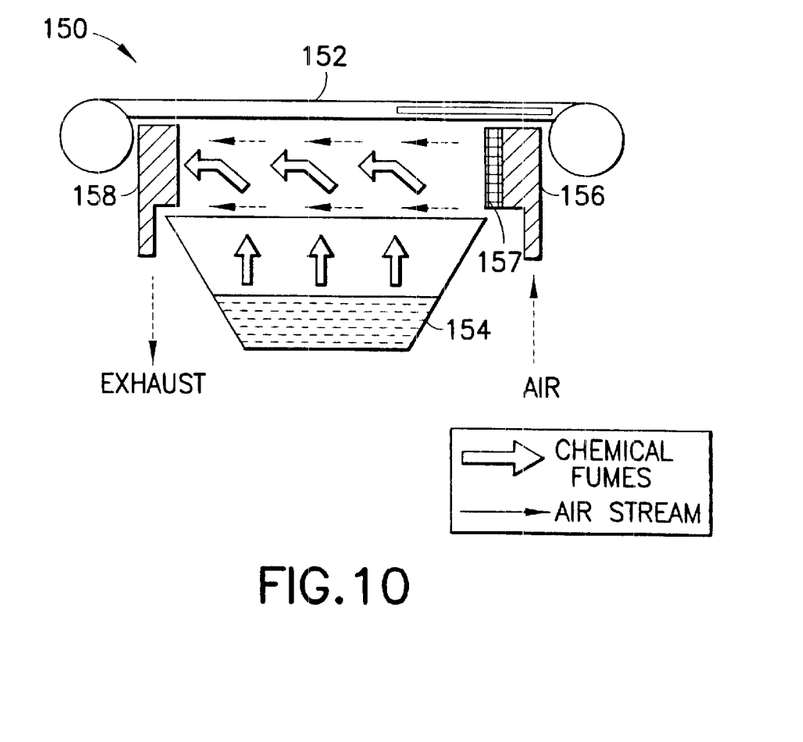
FIG. 10 is a cross-sectional view of the open architecture wet processing station of FIG. 5 having an air manager incorporating both an air manager and a scroll lid assembly.

FIG. 10 shows a cross-sectional view of the open architecture wet processing station of FIG. 5 incorporating both an air manager and a scroll lid assembly.

Thin film member 152 of a scroll lid assembly overlies a chemical tank 154 that releases hazardous chemical fumes. Filtered airflow source 156 of an air manager is positioned at one side of the chemical tank 154 and between the thin film member 152 and the chemical tank. Airflow exhaust 158 of the air manager is positioned at an opposite side of the chemical tank 154 and also between the thin film member and the chemical tank, facing the filtered airflow source 156. In such manner, air stream generated by the filtered airflow source 156 flows between the thin film member 152 and the upper surface of the chemical tank 154 in a direction approximately parallel to the surface of the liquid, so that substantially all deleterious fumes produced at the upper surface of the chemical tank 154 are captured by the air stream, and transported to the airflow exhaust 158 thereby.

Combined use of the air manager and the scroll lid assembly has the following advantages: (1) the scroll lid assembly further regulates the air flow generated by the air manager and serves as addition block against deleterious escape of chemical fumes; (2) the air stream generated by the air manager functions to sweep underneath the thin film member of the scroll lid assembly, capturing most of the chemical fumes before they reach the thin film member, substantially preventing formation of condensed chemicals thereon.

The invention therefore provides an air management system for a semiconductor manufacturing facility involving hazardous liquid chemicals. Such air management system of the invention provides an augmentation of the "push-pull" system (the laminar downflow air providing "push" and the exhaust system providing "pull"), to transport chemical fumes, including drag out fumes (resulting from withdrawal of the wafer or cassette tray out of the liquid in the process tank) to the exhaust system.

It will therefore be appreciated that the air management system of the present invention is susceptible of a wide variety of airflow source and exhaust arrangements within the broad scope of the invention. The air management system provides an augmentation of the conventional push-pull wet station system, that is readily implemented to achieve an airflow above the Critical Capture Velocity at the deck, e.g., a CCV of more than 70 feet per minute at the deck, with minimization of exhaust turbulence and associated adverse hydrodynamic phenomena.

One or more air managers and/or scroll lid assemblies as described hereinabove can also be employed between the wet bench and the plenum box exhaust of an open architecture wet processing station to prevent escape of chemical fumes therefrom.

Various combinations of air managers and scroll lid assemblies may be used in the broad practice of the present invention, or alternatively either of such types of air management systems may be employed in a given application.

When the air manager(s) and scroll lid assembly(ies) are employed in combination with one another, in order to prevent escape of chemical fumes when the scroll lid assembly is in the "open" stage (with the cutout portion of the thin film member exposed), the velocity of the air stream generated by the air manager(s) is preferably adjustable in synchrony with the processing being conducted. Specifically, when the scroll lid assembly is "closed", the air manager generates high velocity air stream, but when the scroll lid assembly is about to "open", the velocity of such air stream is correspondingly reduced to prevent deleterious turbulence around the scroll lid assembly.

The air management systems of the present invention, compared with conventional exhaust systems and fume reduction devices, are mechanically simple, and easy to install and maintain. They significantly reduce energy consumed during operation, and also achieve better process stability and enhance yield and up time.

The features and advantages of the invention are more fully shown with respect to the following illustrative example.

EXAMPLE 1

The air management system of the invention was evaluated in a semiconductor manufacturing facility wet system including a deck that was 128.5 inches in length, overlying a series of process tanks, comprising in sequence a chuck wash tank, a U CLEAN tank, two rinse tanks, two HF tanks, and two rinse tanks.

The U CLEAN tank and one of the HF tanks were studied by velocity profile and fog visualization tests. The deck openings for these tanks were each 11 inches by 15.5 inches. The U CLEAN tank was 16.5 inches wide by 26 inches long, and the HF tank had the same dimensions. Each tank was 11.75 inches tall, and the spacing distance between the upper end of the tank walls and the deck was 6.5 inches. The exhaust box for each tank had an exhaust duct opening 8 inches in diameter.

Measurements were taken at the deck opening above the process tank in each case. The deck opening above each process tank was divided into a 4×3 grid, and measurements were taken in the center of the resulting grid openings in the penetration into the deck, approximately 0.75 inch above the opening.

Downflowing laminar air was passed through a HEPA filter into the wet station.

In a first test of the U CLEAN process tank, operated in conventional fashion, without the air management system of the present invention, the laminar airflow above the tank averaged from 90 feet per minute to 120 feet per minute, measured 0.5 inch below the HEPA filter face. The exhaust flow at the duct was 457 cfm. Capture velocities ranged from 200 feet per minute to 320 feet per minute, a variance of 60%. Aggressive exhaust and laminar airflow rates were required to maintain the air under control over this process tank.

An air management system of the type shown in FIG. 2 was installed at the U CLEAN tank. After the air management system was turned on, critical capture velocities were achieved and maintained. The installation of the air management system was determined to reduce the average HEPA filter airflow velocity to 43 feet per minute, resulting in a 35% reduction in air requirement. Tool exhaust was reduced to 1000 cfm from 1537 cfm. The exhaust flow rate was reduced from 457 cfm to 231 cfm, a 49% reduction. Concurrently, airflow over the deck was more uniform and less turbulent because of the lower air and exhaust requirements made possible by the addition of the air management system.

In the HF tank, prior to installation of the air management system, laminar airflow averaged 61 feet per minute, measured 0.5 inch below the face of the HEPA filter, and the exhaust flow rate was 447 cfm. Capture velocities ranged from 130 feet per minute to 210 feet per minute, a variance of 38%. Aggressive exhaust and laminar airflow rates were required to control the air over the process tank.

After installation of an air management system of the type shown in FIG. 2 on the HF tank, the air management system was turned on, and critical capture velocities were achieved and maintained. Turbulence was no longer evident at the tank level, and exhaust was reduced to 375 cfm from 447 cfm, a 16% reduction, and the velocity of the laminar airflow at the face of the HEPA filter was reduced to 43 feet per minute, resulting in a 35% reduction in air requirement, with tool exhaust being reduced from 1537 cfm to 1000 cfm.

Fog visualization tests conducted on the U CLEAN and the HF tanks before and after installation/operation of the air management system revealed that fume capture was not complete in the original wet station, and that after installation of the air management system, all fumes appeared to be captured by the operation of the air management system.

While the invention has been described herein with respect to various illustrative aspects, features and embodiments, it will be recognized that the invention is not thus limited, but that the present invention extends to and encompasses other features, modifications, and alternative embodiments, as will readily suggest themselves to those of ordinary skill in the art based on the disclosure and illustrative teachings herein. The claims that follow are therefore to be construed and interpreted as including all such features, modifications and alternative embodiments, within their spirit and scope.

What is claimed is:

1. A chemical tank assembly comprising:
   a chemical tank containing chemical that emits fumes;
   an air manager, positioned adjacent to said chemical tank for entraining fumes and preventing their escape, said air manager comprising:
      a filtered airflow source constructed and arranged to generate an air stream; and
      an airflow exhaust comprising an exhaust inlet for receiving the air stream;
      wherein the filtered airflow source and the airflow exhaust are positioned in such a manner that the air stream generated by the filtered airflow source passes across an upper surface of the chemical tank, whereby fumes produced at the surface of the chemical tank are captured by and entrained in the air stream, and transported to the airflow exhaust; and
   a scroll lid assembly positioned adjacent to said air manager for confining the air stream generated by the filtered airflow source to a region adjacent to the chemical tank, wherein said scroll lid assembly comprises:
      (i) a thin film member comprising at least one solid portion and at least one cut-out portion;
      (ii) a first scroll member positioned at a first side of the thin film member for rotatorily moving said thin film member;
      (iii) a motive driver operatively connected to the first scroll member for rotating said first scroll member; and
      (iv) optionally, a second scroll member positioned at a second side of said film member for rotatorily receiving the thin film, in synchrony with rotatory movement of the first scroll member.

2. The chemical tank assembly of claim 1, wherein the filtered airflow source of the air manager is positioned above and adjacent to one side of the chemical tank, and the exhaust inlet of the airflow exhaust is positioned in proximity to an opposite side of the chemical tank.

3. The chemical tank assembly of claim 1, wherein the filtered airflow source of the air manager is positioned above and adjacent to opposing sides of the chemical tank.

4. The chemical tank assembly of claim 1, wherein the air stream from the filtered airflow source of the air manager is directed parallel to the upper surface of the chemical tank.

5. The chemical tank assembly of claim 1, wherein velocity of the air stream generated by the filtered airflow source of the air manager is adjustable.

6. The chemical tank assembly of claim 1, wherein the filtered airflow source of the air manager comprises at least one air purification medium, selected from the group consisting of particulate filter media and chemisorbent media.

7. The chemical tank assembly of claim 1, further comprising a plate member interconnecting the filtered airflow source and the airflow exhaust of the air manager, forming a unitary assembly thereof.

8. The chemical tank assembly of claim 1, wherein the air manager further comprises at least two airflow guides extending from the filtered airflow source to the airflow exhaust, and positioned above an adjacent side of the chemical tank to direct the generated air stream to the area over the upper surface of the chemical tank.

9. The chemical tank assembly of claim 1, located beneath a deck in a semiconductor manufacturing clean room wet chemical processing station, wherein said deck has an opening over the chemical tank for ingress and egress of semiconductor manufacturing workpieces.

10. The chemical tank assembly of claim 9, wherein a laminar downflow air source overlays the deck and the chemical tank assembly.

11. A scroll lid assembly for preventing chemical fumes from escaping from a semiconductor wet processing system, comprising:
    a thin film member comprising at least one solid portion and at least one cut-out portion;
    a first scroll member positioned at a first side of the thin film member for rotatorily moving said thin film member;
    a motive driver operatively connected to the first scroll member for rotating said first scroll member; and
    optionally, a second scroll member positioned at a second side of said film member for rotatorily receiving the thin film, in synchrony with rotatory movement of the first scroll member.

12. The scroll lid assembly of claim 11, wherein the thin film member comprises a material that is non-reactive with the chemical fumes from the wet processing system.

13. The scroll lid assembly of claim 11, wherein the thin film member comprises a transparent or semi-transparent material.

14. The scroll lid assembly of claim 11, wherein the thin film member comprises a transparent polymeric material.

15. The scroll lid assembly of claim 11, comprising the second scroll member.

16. The scroll lid assembly of claim 15, wherein the second scroll member is operated by a spring follower.

17. The scroll lid assembly of claim 11, wherein the motive driver comprises an electric motor.

18. The scroll lid assembly of claim 11, wherein the first and the second scroll member are made of a material that is non-reactive with chemical fumes from the wet processing system.

19. The scroll lid assembly of claim 11, wherein the first and the second scroll member are made of polyvinylidenefluoride.

20. A chemical tank assembly of a semiconductor wet processing system, comprising:
    a chemical tank arranged to contain a liquid chemical producing deleterious chemical fumes at its upper surface; and
    at least one scroll lid assembly as in claim 11, positioned above the chemical tank, for reducing escape of chemical fumes from said chemical tank into a surrounding environment, wherein the thin film member of said scroll lid assembly overlies the chemical tank.

21. The chemical tank assembly of claim 20, wherein the thin film member of the scroll lid assembly is rotatorily movable to a position so that the solid portion of the thin film member is above the upper surface of the chemical tank.

22. The chemical tank assembly of claim 20, wherein the thin film member of the scroll lid assembly is rotatorily movable to a position so that the cut-out portion of the thin film member is above the upper surface of the chemical tank.

23. A wet processing station of a semiconductor manufacturing facility, comprising:
    a liquid chemical tank;
    a deck positioned above the liquid chemical tank and having an opening over the liquid chemical tank for ingress and egress of semiconductor manufacturing workpieces;
    a laminar downflow air source positioned above the deck;
    a below-deck exhaust;
    a below-deck airflow source for flowing an air stream over a surface of liquid in the liquid chemical tank at a sufficient rate and in a sufficient volumetric flow to achieve Critical Capture Velocity (CCV) of vapor released from the liquid during operation of the wet processing station; and
    at least one scroll lid assembly positioned below the deck and above the liquid chemical tank and the below-deck airflow source, for confining the air stream from the below-deck airflow source to a region above the surface of liquid of the liquid chemical tank.

24. The wet processing station of claim 23, wherein the CCV is in the vicinity of 70 feet per minute.

25. The wet station assembly of claim 23, wherein the below-deck airflow source comprises an air plenum member including a purification medium and a motive air driver for inducing flow of air from the plenum member across the liquid surface.

26. The wet station assembly of claim 25, wherein the purification medium in the air plenum member comprises a chemisorbent medium.

27. The wet station assembly of claim 25, wherein flow rate of air from the air plenum member is adjustable.

28. The wet station assembly of claim 23, further comprising airflow guide panels coupled with the plenum member and arranged to direct airflow therefrom across the liquid surface.

29. The wet station assembly of claim 23, wherein said at least one scroll lid assembly comprises:
    a thin film member comprising at least one solid portion and at least one cut-out portion;
    a first scroll member positioned at a first side of the thin film member for rotatorily moving said thin film member;

a motive driver operatively connected to the first scroll member for rotating said first scroll member; and a second scroll member positioned at a second side of said film member for rotatorily receiving the thin film, in synchrony with rotatory movement of the first scroll member.

30. The wet station assembly of claim 23, further comprising a robotic wafer transport device arranged to introduce a semiconductor wafer into the liquid chemical tank for processing therein, and to remove the semiconductor wafer from the liquid chemical tank after processing therein.

31. An open architecture wet processing station of a semiconductor manufacturing facility, comprising:

a wet bench comprising one or more chemical tanks containing liquid chemicals that produce deleterious chemical fumes at their surfaces;

an exhaust for capturing at least a portion of the deleterious chemical fumes by suction; and at least one air management system, selected from the group consisting of air managers and scroll lid assemblies, positioned to substantially prevent escape of the chemical fumes from the vicinity of the wet bench.

32. The open architecture wet processing station of claim 31, comprising at least two scroll lids assemblies.

33. An open architecture wet processing station comprising one or more air managers and one or more scroll lid assemblies, wherein each air manager comprises:

a filtered airflow source constructed and arranged to generate an air stream; and an airflow exhaust comprising an exhaust inlet for receiving said air stream, wherein the filtered airflow source and the airflow exhaust are positioned in such a manner that the air stream generated by the filtered airflow source functions as an air wall outside and adjacent to a source of chemical fumes in said station, and wherein each scroll lid assembly comprises:

a thin film member comprising at least one solid portion and at least one cut-out portion;

a first scroll member positioned at a first side of the thin film member for rotatorily moving said thin film member;

a motive driver operatively connected to the first scroll member for rotating said first scroll member; and optionally, a second scroll member positioned at a second side of said film member for rotatorily receiving the thin film, in synchrony with rotatory movement of the first scroll member, wherein the scroll lid assembly is positioned adjacent to the air manager, so that the thin film member of the scroll lid assembly confines the air stream generated by the filtered airflow source to a region adjacent to the source of chemical fumes in said station.

34. The open architecture wet processing station of claim 33, wherein the filtered airflow source of each air manager comprises at least one air purification medium, selected from the group consisting of particulate filter media and chemisorbent media.

35. An air management system for installation in an open architecture wet bench or an enclosed mini-environment wet bench, said air management system comprising:

at least one air manager having an air source and air exhaust arranged for flowing air across an open chemical tank, to entrain fumes from chemical in the tank that otherwise may migrate from the immediate vicinity of the tank, and transport such fumes to the exhaust with the air flowed from the air source to the exhaust, and at least one scroll lid assembly positioned adjacent to said air manager and said chemical tank so as to further entrain the fumes from the chemical in the tank.

36. The air management system of claim 35, in which the chemical tank is below a deck, and the air flowed across the open chemical tank is maintained below the deck.

37. The air management system of claim 35, wherein said air manager is embodied in a structural assembly comprising a plate member having air source and air exhaust members mounted thereon, whereby the air management system may be employed as a retrofit apparatus for an existing semiconductor manufacturing facility.

38. Use of an air management system as in claim 35, installed in an open architecture wet bench facility and with the air source member of the air manager incorporating or arranged for connection to a high purity air supply.

39. A wet bench facility including an open topped chemical tank shrouded by air managers to provide a virtual wall containment of the fumes from the tank, wherein each virtual wall is formed by an air manager including an air source and an air exhaust, arranged to produce a generally flat air stream bordering a perimeter area of the chemical tank or the wet bench itself, and wherein said chemical tank is further shrouded by at least one scroll lid assembly positioned adjacent to at least one air manager.

40. The wet bench facility of claim 39, wherein velocity of the air stream generated by the air source is adjustable.

41. A method of containing hazardous fumes emanating from a surface of a liquid chemical in a liquid chemical tank and reducing chemical contamination in a controlled environment including said liquid chemical tank, said method comprising the steps of:

providing an airflow source for generating an airflow and an airflow exhaust having an inlet constructed and arranged to receive the airflow;

positioning the airflow source and the airflow exhaust inlet in such an manner that airflow from the airflow source flows over the surface of the liquid chemical in the liquid chemical tank to the airflow exhaust inlet;

flowing an airflow from the airflow source in a generally horizontal stream over the surface of the liquid chemical to the airflow exhaust inlet, whereby substantially all deleterious fumes emanating from the surface of the liquid chemical are captured by and entrained in the airflow, and flow into the airflow exhaust; and providing a lid member including at least one solid portion and at least one cut-out portion, and disposing the lid member above the surface of the liquid for selective translation thereacross, whereby said at least one cut-out portion is selectively positionable over the surface of the liquid;

wherein the airflow is confined to a region above the surface of the liquid.

42. A method of containing hazardous fumes emanating from a surface of a liquid chemical in a liquid chemical tank and reducing chemical contamination in a controlled environment including said liquid chemical tank, said method comprising the steps of:

providing an airflow source for generating an airflow and an airflow exhaust having an inlet constructed and arranged to receive the airflow;

positioning the airflow source and the airflow exhaust inlet in such a manner that airflow from the airflow source flows over the surface of the liquid chemical in the liquid chemical tank to the airflow exhaust inlet; and flowing an airflow from the airflow source in a generally horizontal stream over the surface of the liquid chemical to the airflow exhaust inlet, whereby substantially all deleterious fumes emanating from the surface of the liquid chemical are captured by and entrained in the airflow, and flow into the airflow exhaust, and wherein the airflow is confined to a region above the surface of the liquid by guide structures at sides of the liquid chemical tank.

43. A method of containing hazardous fumes emanating from a surface of a liquid chemical in a liquid chemical tank and reducing chemical contamination in a controlled environment including said liquid chemical tank, said method comprising the steps of:

providing an airflow source for generating an airflow and an airflow exhaust having an inlet constructed and arranged to receive the airflow;

positioning the airflow source and the airflow exhaust inlet in such an manner that airflow from the airflow source flows over the surface of the liquid chemical in the liquid chemical tank to the airflow exhaust inlet; and flowing an airflow from the airflow source in a generally horizontal stream over the surface of the liquid chemical to the airflow exhaust inlet, whereby substantially all deleterious fumes emanating from the surface of the liquid chemical are captured by and entrained in the airflow, and flow into the airflow exhaust, and wherein the airflow is confined to a region above the surface of the liquid by a scroll lid assembly positioned above the liquid chemical tank, the airflow source, and the airflow exhaust.

44. A method of increasing the efficiency of localized exhaust in a semiconductor manufacturing clean room, comprising retrofitting the clean room to comprise a scroll lid assembly as in claim 11.

45. A semiconductor fabrication facility clean room including:

a ceiling-to-floor laminar airflow system, a liquid chemical tank for containing a liquid chemical composition producing fumes from a liquid surface thereof, an air manager including an airflow source and an airflow exhaust inlet arranged in facing relationship to one another at opposing sides of the liquid chemical tank above the liquid surface, with the airflow source and airflow exhaust inlet being constructed and arranged to maintain airflow across the surface of the liquid chemical from the airflow source to the airflow exhaust inlet at an airflow velocity above the Critical Capture Velocity of chemical liquid fumes from the liquid chemical in the liquid chemical tank; and a scroll lid assembly positioned above the liquid chemical tank and the air manager for confining the airflow from the airflow source to a region above the liquid surface.

46. A method of operating a semiconductor fabrication facility clean room including a ceiling-to-floor laminar airflow system, exhaust equipment and a liquid chemical tank for containing a liquid chemical composition producing fumes from a liquid surface thereof, the method comprising:

providing an airflow source and airflow exhaust inlet at opposite sides of the liquid chemical tank above the liquid surface, directing airflow across the liquid chemical surface from the airflow source to the airflow exhaust inlet at an airflow velocity above the Critical Capture Velocity of chemical liquid fumes from the liquid chemical in the liquid chemical tank; and positioning a scroll lid assembly above the airflow source and the airflow exhaust inlet to confine the airflow to a region above the liquid surface of the liquid chemical tank.

* * * * *